United States Patent [19]

Ketzler

[11] Patent Number: 4,714,924
[45] Date of Patent: Dec. 22, 1987

[54] ELECTRONIC CLOCK TUNING SYSTEM

[75] Inventor: John H. A. Ketzler, White Bear Lake, Minn.

[73] Assignee: ETA Systems, Inc., St. Paul, Minn.

[21] Appl. No.: 814,654

[22] Filed: Dec. 30, 1985

[51] Int. Cl.[4] .......................... H04Q 9/04; H03K 5/13
[52] U.S. Cl. ............................. 340/825.210; 307/595;
307/602; 371/1
[58] Field of Search ........... 340/825.2, 825.61, 875.21;
307/582, 269, 590, 595, 606, 602, 603, 480;
370/108; 375/106, 107; 328/72, 155, 55, 63;
371/1

[56] References Cited

U.S. PATENT DOCUMENTS

| | | | |
|---|---|---|---|
| 3,171,981 | 3/1965 | Wolterman | 307/88.5 |
| 3,418,498 | 12/1968 | Farley | 307/293 |
| 3,633,113 | 1/1972 | Grubel | 328/29 |
| 3,675,049 | 7/1972 | Haven | 307/602 |
| 3,725,793 | 4/1973 | Phillips | 328/63 |
| 3,753,012 | 8/1973 | Frederiksen et al. | 307/293 |
| 4,208,724 | 6/1980 | Rattlingourd | 364/900 |
| 4,241,418 | 12/1980 | Stanley | 364/900 |
| 4,321,687 | 3/1982 | Parsons et al. | 364/900 |
| 4,412,342 | 10/1983 | Khan et al. | 375/107 |
| 4,414,637 | 11/1983 | Stanley | 364/569 |
| 4,419,739 | 12/1983 | Blum | 364/900 |
| 4,447,870 | 5/1984 | Tague et al. | 364/200 |
| 4,479,216 | 10/1984 | Krambeck et al. | 371/61 |
| 4,482,819 | 11/1984 | Oza et al. | 328/63 |
| 4,482,826 | 11/1984 | Ems et al. | 307/602 |
| 4,488,297 | 12/1984 | Vaid | 328/55 |
| 4,503,490 | 3/1985 | Thompson | 375/106 |
| 4,514,647 | 4/1985 | Shoji | 307/269 |
| 4,623,805 | 11/1986 | Flora et al. | 307/602 |
| 4,626,716 | 12/1986 | Miki | 307/602 |

Primary Examiner—Donald J. Yusko
Attorney, Agent, or Firm—Kinney & Lange

[57] ABSTRACT

An electronic clock tuning system for a digital computer of the type including a plurality of major function circuit boards comprised of a plurality of gate arrays. A clock pulse train is produced by a master oscillator, and distributed to each major function circuit board by a master fanout. The clock pulse train is distributed throughout each major function circuit board by a local fanout. Each major function circuit board includes a plurality of electronic delay arrays, each of which distributes the clock pulse train to a group of gate arrays on the major function board, and delays the clock pulse train supplied to each gate array by one of a plurality of discrete delay periods. Each electronic delay array includes shift registers for serially receiving digital delay tuning codes and for producing digital delay select signals representative of discrete delay periods. Delay circuits on each electronic delay array are responsive to one of the shift registers, and delay the clock pulse trains supplied to the gate arrays by discrete delay periods represented by the digital delay select signals.

15 Claims, 4 Drawing Figures

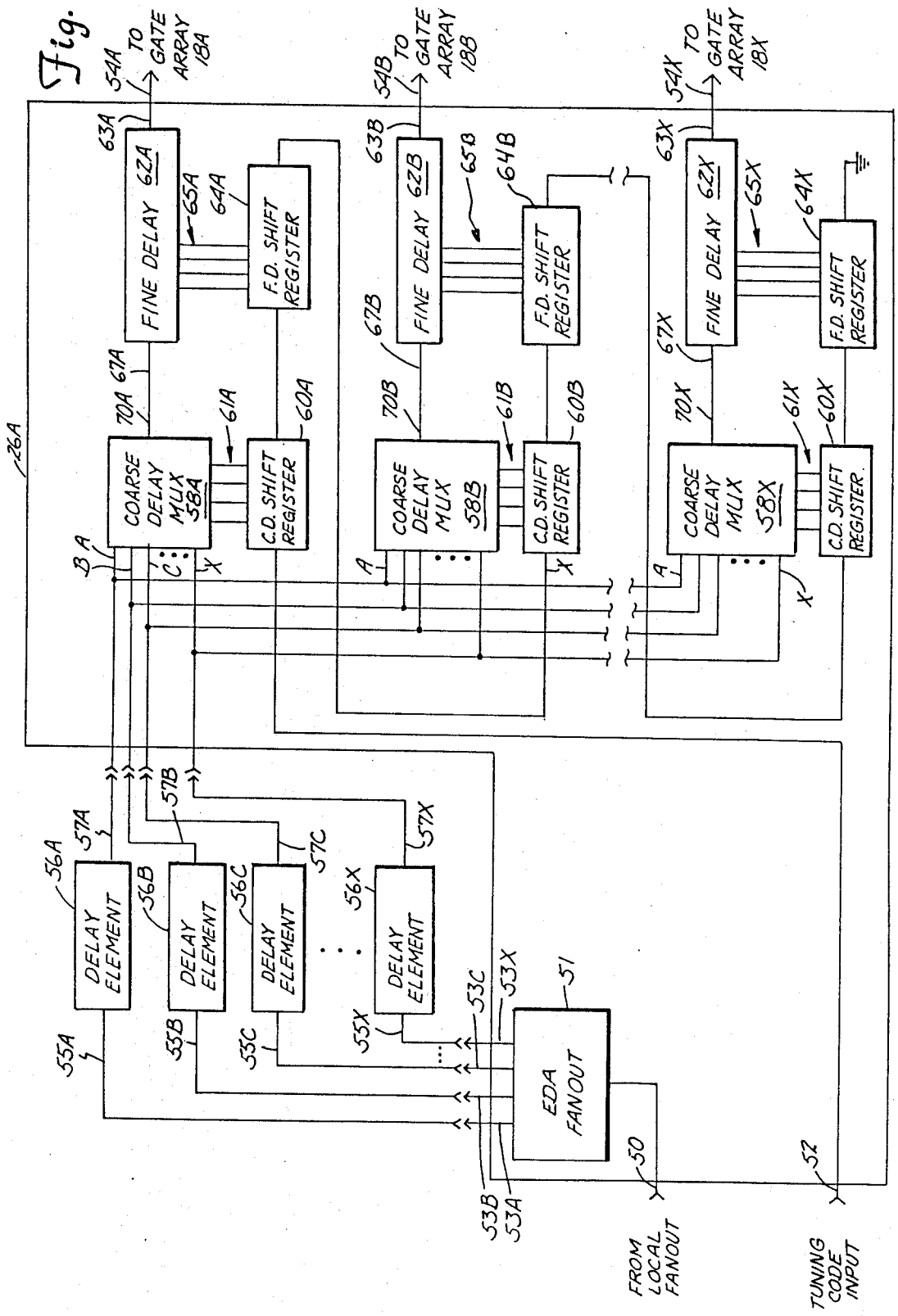

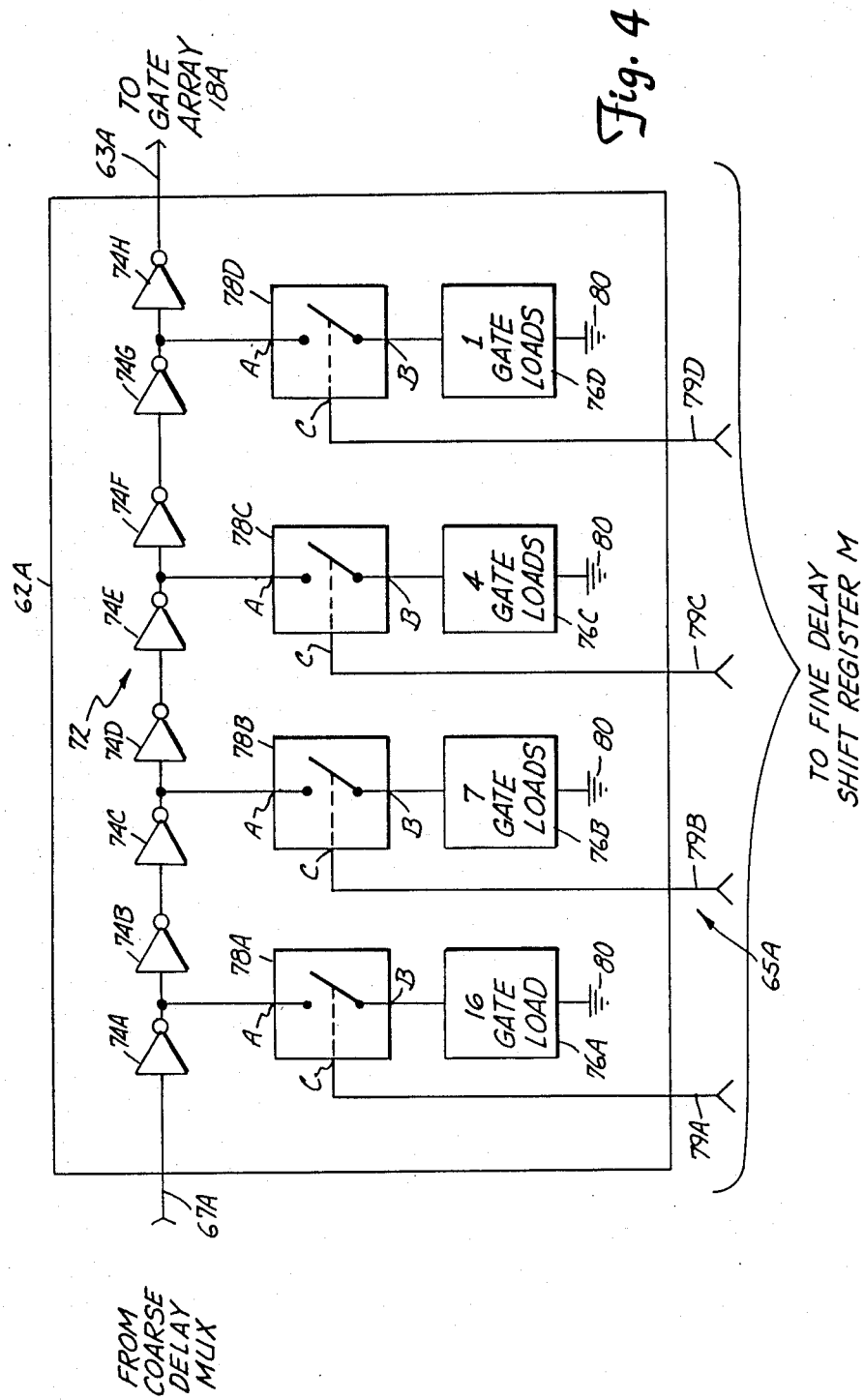

ELECTRONIC CLOCK TUNING SYSTEM

BACKGROUND OF THE INVENTION

1. Field of the Invention.

The present invention relates to clock systems used in digital computers. In particular, the present invention is an electronic clock tuning system for tuning the delay of clock pulses distributed throughout the computer.

2. Description of the Prior Art.

Modern digital computers are formed by hundreds of thousands and even millions of logic elements. In computer architectures which are highly integrated, these logic elements are fabricated on very large-scale integrated (VLSI) circuit chips known as gate arrays. The gate arrays themselves are organized onto a plurality of major function circuit boards which are dedicated to the performance of specific tasks. A supercomputer, for example, can include a central processing unit (CPU), memory interface, and input/output (I/O) major function circuit boards. Each of these circuit boards will typically be formed by hundreds of gate arrays.

In order to achieve a high data throughput, operations are distributed throughout the computer, and performed in "parallel." Processed data and microinstructions are communicated between individual gate arrays, and between major function circuit boards. It is extremely important, therefore, that all microinstructions and data transfers executed by the gate arrays be synchronized with those of other gate arrays. To this end, the computer includes a central clock system for dividing and or "clocking" operations performed by all gate arrays.

The clock system will include a master oscillator which is the source of clock signals for all gate arrays. A clock pulse train produced by the master oscillator is divided, and replicas thereof distributed to each major function circuit board by a master fanout circuit. On each major function circuit board the clock pulse train is further divided, and distributed to each gate array through a local fanout circuit. Each gate array is, therefore, clocked by a replica of the pulse train produced by the master oscillator. While this technique helps maintain synchronization between gate arrays, it is inadequate for the high degree of performance demanded of modern supercomputers.

Even minute discrepancies between the phases of the clock pulse trains arriving at different gate arrays can have disastrous consequences on computer operation. These discrepancies, or skews, are the product of numerous factors. Variables such as operating temperature, supply voltage, component tolerance variables due to manufacturing processes, and differing path lengths between master oscillator and gate arrays, all contribute to skew between the clock pulse trains. Adding to the problem is the fact that many of these factors cannot be accurately controlled.

Obviously, the higher the frequency of the clock pulse train, the faster the computer can process data. Frequency of the clock pulse train, however, is limited by the uncertainty, or maximum skew, introduced between clock pulse trains supplied to various gate arrays. Simply put, computer performance can be greatly increased by reducing skews introduced by the clock system.

Currently used techniques for tuning computer clock systems are primarily manual. A technician will measure the time delay in the distribution path between the master oscillator and each and every gate array. A length of coaxial cable in each path is then removed, trimmed, and reinserted. This procedure is repeated until the delay in the clock pulse train at each gate array is within predetermined tolerances. This procedure is obviously very labor intensive. It must be performed for each and every one of the hundreds of gate arrays on the computer. On a supercomputer, this procedure can take several weeks.

There is clearly a continuing need for improved apparatus for tuning clock systems in digital computers. An electronic clock tuning system would be especially desirable. Electronic test equipment could then be used to tune the clock pulse train supplied to each gate array. Computer "setup" time could be greatly reduced by the elimination of tedious and labor intensive tasks. An electronic clock tuning system of this type could also be extremely accurate, and significantly increase computer performance by permitting gate arrays to be clocked at frequencies approaching their specified maximums. The system should, of course, also be relatively simple and inexpensive.

SUMMARY OF THE INVENTION

The present invention is an electronic clock tuning system for delaying a clock pulse train by one of a plurality of discrete delay periods. The electronic clock tuning system includes means for producing digital delay select signals representative of the discrete delay periods, and means responsive thereto for delaying the clock pulse train by discrete delay periods represented by the delay select signals. Use of this system permits clock pulse trains distributed to individual gate arrays throughout a computer to be tuned so as to have identical phases or skews. This task can be quickly performed by electronic test equipment, thereby significantly reducing computer setup time and expense. The extremely high degree of accuracy obtainable through use of the system permits all gate arrays to be clocked at frequencies approaching the upper limits of their specifications, and still be accurately synchronized with all other gate arrays within the computer. As a result, the clock tuning system is an important contribution to the performance required for demanding supercomputer applications.

In a preferred embodiment, the means for producing the digital delay select signals includes a coarse delay register and a fine delay register. The coarse delay register is adapted to receive coarse delay tuning codes, and produces coarse delay select signals representative of one of a plurality of discrete coarse delay periods. The fine delay register is adapted to receive fine delay tuning codes, and produces fine delay select signals representative of one of a plurality of discrete fine delay periods.

The means for delaying the clock pulse train by discrete delay periods includes a fine delay circuit, and a coarse delay circuit. The coarse delay circuit is responsive to the coarse delay register, and includes a plurality of first delay elements having an input connected to receive the clock pulse train, and an output. Each coarse delay element is adapted to delay the clock pulse train by one of the plurality of discrete coarse delay periods. The coarse delay circuit also includes a multiplexer which has signal inputs connected to the outputs of the first delay elements to receive the delayed clock pulse trains, a signal output, and a control input responsive to the coarse delay register. The multiplexer supplies to its signal output one of the delayed clock pulse trains, as represented by the coarse delay select signal.

The fine delay circuit is connected to receive the coarse delay clock pulse train from the multiplexer, and further delays the clock pulse train by one of a plurality of fine delay periods. The fine delay circuit includes a transmission line to which a plurality of binary weighted loads are switchably interconnected by transmission gates. The transmission gates are responsive to the fine delay register, and the fine delay circuit further delays the clock pulse train by one of a plurality of fine delay periods, as represented by the fine delay select signals.

In one preferred embodiment, the coarse course delay circuit means introduce one of a sixteen delay register is a four bit shift register, and the coarse delay periods which are integer multiples of five hundred picoseconds. The fine delay shift register is also a four bit shift register, and fine delay circuit means further delays the clock pulse train by one of sixteen fine delay periods which are interger multiples of one hundred picoseconds. Clock pulse trains can thereby be tuned to an accuracy of one hundred picoseconds.

BRIEF DESCRIPTION OF THE DRAWINGS

FIG. 3 is a block diagram representation of an electronic delay array (EDA) shown in FIGS. 1 and 2.

FIG. 4 is a schematic representation of a fine delay circuit element shown in FIG. 3.

DETAILED DESCRIPTION OF THE PREFERRED EMBODIMENTS

Figure 1:
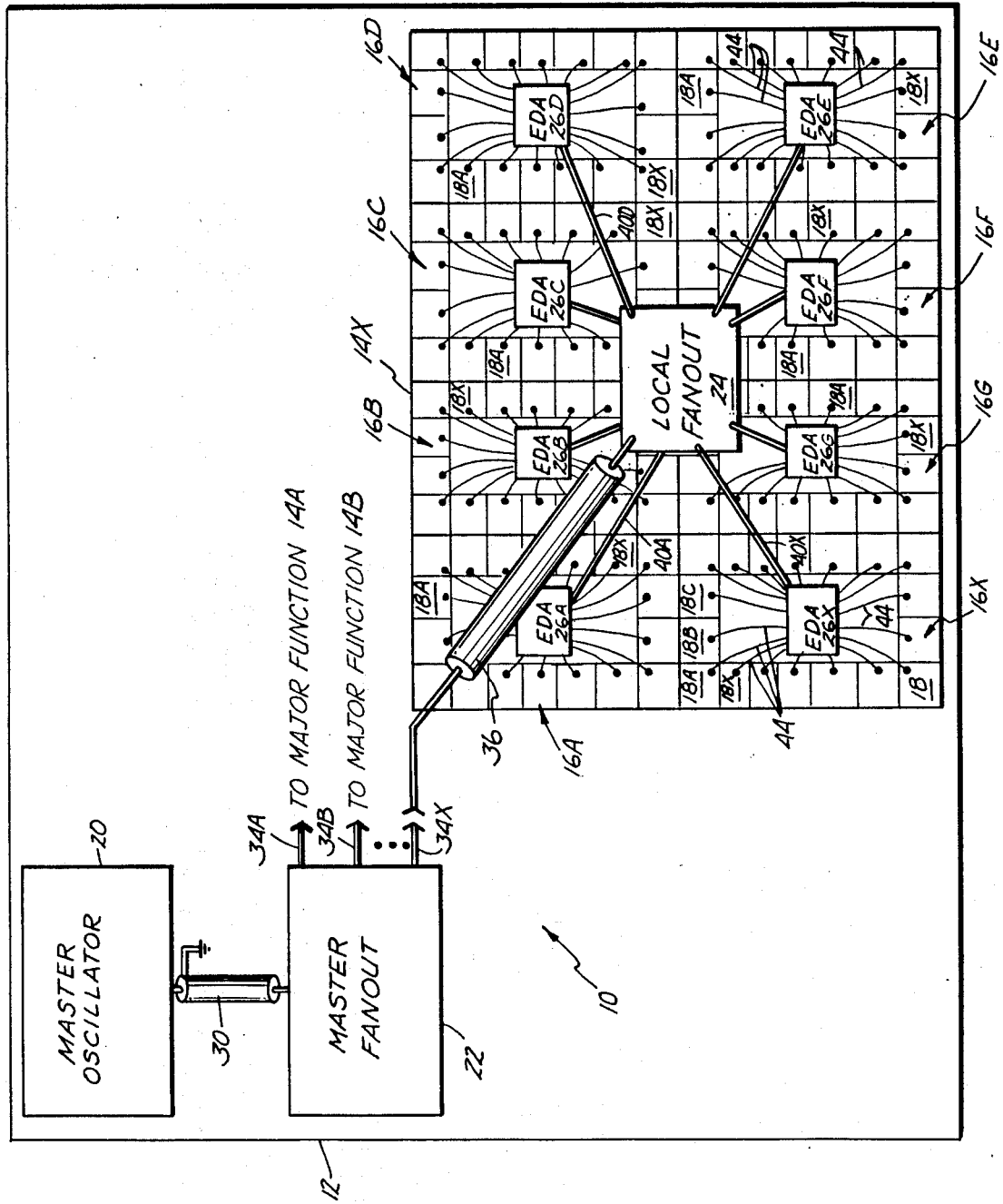
FIG. 1 is a block diagram representation of a computer which includes the electronic clock tuning system of the present invention.

A computer 12 which includes electronic clock tuning system 10 of the present invention is illustrated in block diagram form in FIG. 1. Computer 12 is highly integrated, and formed by a plurality of major function circuit boards 14A-14X (only 14X is illustrated). Major function circuit boards 14 are subsystems of computer 12, and are dedicated to performing specific operations. In one embodiment, computer 12 is a high speed supercomputer, which includes a central processing unit board, a shared memory interface board, and an input-/output interface board.

Each major function circuit board 14 is organized into a plurality of smaller functional units or regions 16A-16X. In one embodiment (not shown), major function boards 14 can include up to sixteen regions 16. Each region 16 is in turn formed by a plurality of very large-scale integrated (VLSI) circuit elements or gate arrays 18A-18X. Gate arrays 18A-18X can also be characterized as subsystem components of major function boards 14A-14X. Logic elements which perform digital operations are fabricated onto gate arrays 18 during manufacture.

Figure 2:
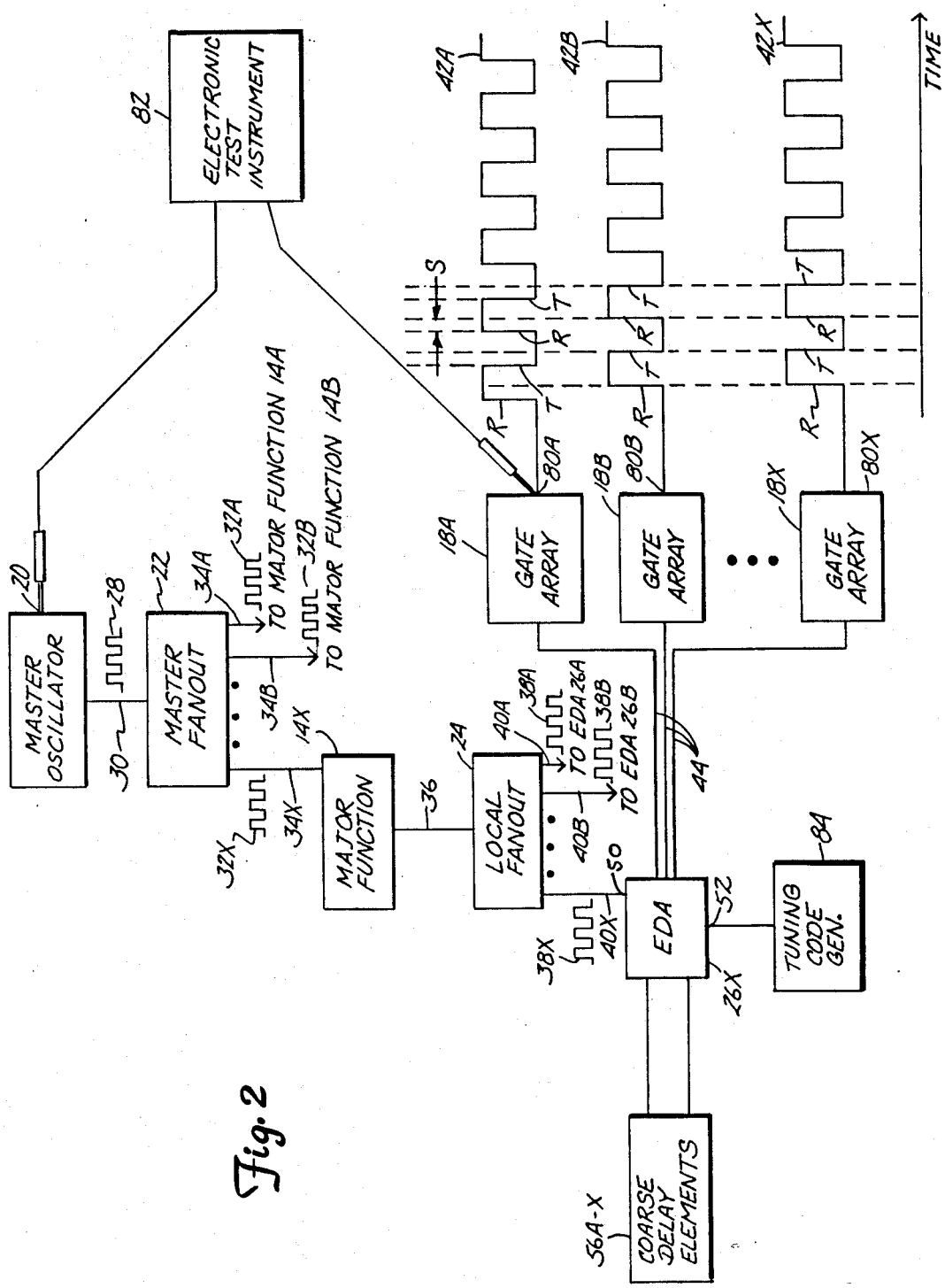
FIG. 2 is a block diagram representation of the electronic clock tuning system shown in FIG. 1.

Clock tuning system 10, as shown in FIGS. 1 and 2, includes master oscillator 20, master fanout circuit 22, a local fanout circuit 24 on each major function board 14, and a plurality of electronic delay arrays (EDA) 26A-26X, one of which is associated with each region 16 of major function board 14. As shown in FIGS. 2 and 3, a plurality of first or coarse delay elements 56A-56X are associated with each EDA 26A-26X. Delay elements 56A-56X are not shown in FIG. 1 for reasons of clarity.

Operation of clock tuning system 10 is perhaps best illustrated with reference to FIG. 2. Master oscillator 20 produces a source clock pulse train 28 which is supplied to master fanout circuitry 22 by a transmission line such as coaxial cable 30. As shown, clock pulse train 28 is comprised of a plurality of rectangular pulses which switch between first and second logic states (e.g. logic "0" and logic "1" states) at a master frequency.

Master fanout circuit 22 is connected to receive clock pulse train 28, and produces a plurality of major function clock pulse trains 32A-32X. Clock pulse trains 32A-32X are replicas of clock pulse train 28, and are distributed to one of major function boards 14A-14X on transmission lines 34A-34X, respectively.

On each major function board 14, (board 14X, for example, as shown in FIGS. 1 and 2) major function clock pulse train (32X in this example) is supplied to a local fanout circuit 24 by a transmission line such as coaxial cable 36. Local fanout circuit 24 divides clock pulse train 32 and produces a plurality of EDA clock pulse trains 38A-38X. EDA clock pulse trains 38A-38X are supplied to electronic delay arrays 26A-26X by transmission lines 40A-40X, respectively, as shown.

From each EDA 26A-26X, the EDA clock pulse train 38 is again divided, and a plurality of tuned clock pulse trains 42A-42X are produced. Each tuned clock pulse train 42A-42X is a replica of EDA clock pulse train 38, and, therefore, source clock pulse train 28. A tuned clock pulse train 42A-42X is supplied to each gate array 18A-18X, respectively, of each region 16A-16X by a transmission line 44.

Having been propagated to the respective gate arrays 18 through transmission lines 30, 34, 36, 40, and 44, fanout circuits 22 and 24, and electronic delay arrays 26A-26X, clock pulse trains 42A-42X will have been delayed due to various factors. Different delays will have been introduced to different clock pulse trains 42A-42X. As a result, some of tuned clock pulse trains 42A-42X will be out of phase, or skewed, with respect to others. Clock pulse trains 42B and 42X, for example, as illustrated in FIG. 2, have arrived at gate arrays 18B and 18X, respectively, with no phase difference or skew. As illustrated, their rising edges R and trailing edges T occur at identical times. Clock pulse train 42A, however, has arrived at gate array 18A with a different delay than that of clock pulse trains 42B and 42X. As shown, rising edges R of clock pulse train 42A are skewed with respect to those of clock pulse trains 42B and 42X by a period S. As a result, the operations being performed by gate array 18A will not be synchronized with those performed by gate arrays 18B and 18X.

Through the use of electronic delay arrays 26A-26X, gate array clock pulse trains 42A-42X can all be electronically tuned so as to have identical delays when they arrive at a test point on their respective gate array 18A-18X. Clock pulse trains 42A-42X will, therefore, have identical phases, and no skew S. In this manner, all microinstruction executions and data transfers of gate arrays 18 can be synchronized with those of all other gate arrays 18. Computer 12 can, therefore, operate at higher speeds, and achieve higher performance levels.

A preferred embodiment of electronic delay array 26A (which is typical of EDA's 26A-26X) is illustrated in FIG. 3. Electronic delay array 26A has an input terminal 50 connected to receive an EDA clock pulse train 38A from local fanout circuit 24. EDA 26A includes an EDA fanout 51 which is connected to input terminal 50. EDA fanout 51 divides, and produces a plurality of replicas of EDA clock pulse train 38A, for distribution to delay elements 56A-56X through terminals 53A-53X. Digital tuning codes, preferably in serial format, are received by EDA 26A on tuning code input terminal 52. Tuned gate array clock pulse trains 42A-42X are supplied to gate arrays 18A-18X through pins 54A-54X, respectively.

Associated with EDA 26A are a plurality of discrete delay elements 56A-56X. Delay elements 56A-56X are preferably external to EDA 26A. Each delay element 56A-56X, respectively, has an input terminal 55A-55X connected to terminals 53A-53X, respectively, of EDA fanout 51, and an output terminal 57A-57X. Each delay element 56A-56X delays EDA clock pulse train 38A by one of a plurality of first, or coarse, delay periods. In one preferred embodiment, EDA 26A includes sixteen delay elements 56A-56X, each of which delays the EDA clock pulse train 38A by an integer multiple of five hundred picoseconds. Delay element 56A, for example, delays the received clock pulse train by five hundred picoseconds, while delay element 56B delays the received clock pulse train by one thousand picoseconds, and so on. Although delay elements 56A-56X can take other forms, in one preferred embodiment they are different lengths of printed circuit delay line which closely approximate the desired coarse delay periods.

EDA 26A also includes coarse delay multiplexers 58A-58X, first or coarse delay (C.D.) shift registers 60A-60X, second or fine delay circuits 62A-62X, and second or fine delay (F.D) shift registers 64A-64X. Together, each coarse delay multiplexer 58A-58X and delay elements 56A-56X form a coarse delay circuit. Each coarse delay multiplexer 58A-58X, coarse delay shift register 60A-60X, fine delay circuit 62A-62X, and fine delay shift register 64A-64X is associated with one of gate arrays 18A-18X for which EDA 26X produces a tuned clock pulse train 42A-42X, respectively.

Coarse and fine delay shift registers 60A-60X and 64A-64X, respectively, are preferably all connected in a series arrangement for the serial transfer of delay tuning codes received on tuning code input pin 52. In the embodiment shown, all shift registers 60A-60X and 64A-64X are four bit shift registers. Coarse delay shift registers 60A-60X serially receive, and store, coarse delay tuning codes, and produce a four bit coarse delay select signal representative of one of sixteen discrete coarse delay periods on busses 61A-61X, respectively. Similarly, each fine delay shift register 64A-64X serially receives, and stores, a fine delay tuning code representative of one of sixteen discrete fine delay periods, and produces four bit fine delay select signals representative thereof on busses 65A-65X, respectively.

In the embodiment shown, each coarse delay multiplexer 58A-58X is a sixteen input multiplexer, and has input terminals A-X connected to output terminals 57A-57X of delay elements 56A-56X, respectively. Each coarse delay multiplexer 58A-58X also has a four bit control terminal connected to bus 61A-61X, respectively, to receive the four bit coarse delay select signal from its respective coarse delay shift register 60A-60X. In response to the particular coarse delay select signal received at its control terminal, coarse delay multiplexers 58A-58X will supply to their output terminal 70 one of the sixteen coarse delayed clock pulse trains from signal input terminals A-X. In this manner, each coarse delay multiplexer 58A-58X delays EDA clock pulse train 38A by one of sixteen discrete coarse delay periods.

Fine delay circuit elements 62A-62X have input terminals 67A-67X, respectively, connected to receive the coarse delayed EDA clock pulse train from coarse delay multiplexers 58A-58X, respectively, and an output terminal 63A-63X. A four bit control terminal of each fine delay circuit element 62A-62X is connected to bus 65A-65X, respectively, to receive the four bit fine delay select signal from its respective fine delay shift register 64A-64X. In response to the fine delay select signal, fine delay circuit elements 62A-62X further delay the coarse delayed EDA clock pulse train by one of sixteen discrete fine delay periods. These further delayed EDA clock pulse trains are output pins 54A-54X, respectively, as tuned clock pulse trains 42A-42X.

A preferred embodiment of fine delay circuit element 62A (which is typical of elements 62A-62X) is illustrated in FIG. 4. Input terminal 67A and output terminal 63A are interconnected by a transmission line 72 which includes a plurality of inverters 74A-74H connected in a series arrangement. Four load elements 76A-76D are adapted to be interconnected to transmission line 72 by electronic transmission gates 78A-78D, respectively. Each transmission gate 78A-78D has a first terminal A connected to transmission line 72, a second terminal B connected to its respective load element 76A-76D, and a control terminal C connected to one of control terminal pins 79A-79D. Control terminal C of each transmission gate 78A-78D, therefore, receives from bus 65A one bit of the fine delay select signal produced by the fine delay shift register 64A to which it is attached. Each load element 76A-76D is connected between a power supply potential (not shown), ground 80, and terminal B of its respective transmission gate 78A-78D.

Although schematically represented as switches in FIG. 4, transmission gates 78A-78D are electronic transmission gates fabricated on EDA 26A. When a first (e.g. a logic "0" state) signal is received at their control terminals C, transmission gates 78A-78D are in their OPEN conduction state, electrically disconnecting load elements 76A-76D from transmission line 72. When the particular bit of a fine delay select signal has a second (e.g. a logic "1") state, the corresponding transmission gate 78A-78D will be in a CLOSED conduction state, and electrically connect its load element 76A-76D to transmission line 72. When one of load elements 76A-76D is connected to transmission line 72, it loads transmission line 72 and thereby further delays propagation of the EDA clock pulse train therethrough.

In a preferred embodiment, load elements 76A-76D are formed by MOS transistors in a manner well known to those skilled in the art. Load elements 76A-76B are also binary weighted so that one of sixteen discrete fine delay periods can be added to the clock pulse train. Gate load 76A preferably has a binary weight of eight, and will further delay the clock pulse train by eight hundred picoseconds when interconnected to transmission line 72 by transmission gate 78A. Gate load 76B has a binary weight of four, and will delay the clock pulse train by four hundred picoseconds. Gate load 76C has a binary weight of two, and will further delay the clock pulse train by two hundred picoseconds. Gate load 76D has a binary weight of one, and will further delay the clock pulse train by one hundred picoseconds when interconnected to transmission line 72 by transmission gate 78D. The fine delay select signals produced by fine delay shift registers 64 can, therefore, digitally represent one of sixteen fine delay periods, each of which is an integer multiple of one hundred picoseconds.

A preferred method of using clock tuning system 10 is illustrated in FIG. 2. Gate arrays 18A-18X preferably include a built-in self-test system having a test data output pin 80A-80X, respectively, from which a copy of the tuned clock pulse train can be monitored. Since the clock pulse train is propagated through portions of gate arrays 18A-18X, delays dependent upon the particular fabrication batch can be compensated for. Electronic test instrument 82 is used to measure the delay introduced to the clock pulse train between master oscillator 20 and test data output pin 80A-80X of each gate array 18A-18X. Delay tuning code generator 84 then produces tuning codes which are applied to tuning code input pin 52 so as to tune the tuned clock pulse train 42 until a predetermined time delay is established. In this manner, all gate arrays 18A-18X of all major functions 14 can be tuned so as to have identically delayed clock pulse trains 42. This procedure can be automated, and quickly performed.

Although the present invention has been described with reference to preferred embodiments, those skilled in the art will recognize that changes may be made in form and detail without departing from the spirit and scope of the invention.

What is claimed is:

1. An electronic clock tuning system for distributing tuned clock pulse trains to integrated circuit gate arrays of a digital computer in which the gate arrays are organized into a plurality of regions on each of a plurality of major function circuit boards; including:
    master oscillator means for producing a clock pulse train;
    master fanout means operatively connected to the master oscillator means for distributing the clock pulse train to each major function circuit board;
    a plurality of local fanout means, each mounted with respect to one of the major function circuit boards and operatively connected to the master fanout means for distributing the clock pulse train to each region of the major function circuit board;
    tuning code generator means for generating coarse and fine digital delay tuning codes, for each gate array, representative of desired discrete
    a plurality of electronic delay means, each associated with and mounted with respect to a region of a major function circuit board and operatively connected to the local fanout means on the circuit board, for distributing the clock pulse train to each gate array of the region of the main function circuit board with which it is associated, and for delaying the distributed clock pulse train by one of a plurality of discrete delay periods, each electronic delay means comprising for each gate array of the region with which it is associated:
        coarse delay select means coupled to the tuning code generator means for producing digital coarse delay select signals as a function of the coarse delay tuning codes;
        fine delay select means coupled to the tuning code generator means for producing digital fine delay select signals as a function of the fine delay tuning codes;
        coarse delay means coupled to the coarse delay select means for delaying the clock pulse train supplied to the gate array by discrete coarse delay periods represented by the coarse delay select signals; and
        fine delay means coupled to the coarse delay means and the fine delay select means for delaying the clock pulse train supplied to the gate array by discrete fine delay periods represented by the fine delay select signals.

2. The electronic clock tuning system of claim 1 wherein:
    the electronic delay means further includes:
        electronic delay fanout means coupled to the local fanout means for distributing the clock pulse train; and a plurality of coarse delay elements having an input connected to receive a clock pulse train from the electronic delay array fanout means, and an output, each coarse delay element adapted to delay the received clock pulse train by one of the discrete coarse delay periods; and
    the coarse delay means includes a multiplexer having signal inputs connected to the output of one of the delay elements, a signal output, and control inputs responsive to the coarse delay select means, for supplying at its signal output coarse delayed clock pulse trains represented by the coarse delay select signals.

3. The electronic clock tuning system of claim 2 wherein the coarse delay select means include coarse delay shift register means for serially receiving the digital coarse delay tuning codes and for producing the digital coarse delay select signals.

4. The electronic clock tuning system of claim 3 wherein:
    each of the coarse delay shift register means is a four bit shift register which receives a four bit digital coarse delay tuning code and produces a four bit digital coarse delay select signal representative of one of sixteen discrete coarse delay periods;
    each electronic delay array means includes sixteen coarse delay elements, each delaying the clock pulse train by a different coarse delay period; and
    each of the multiplexers is a sixteen input multiplexer.

5. The electronic clock tuning system of claim 4 wherein each of the sixteen coarse delay periods is a multiple of a five hundred picosecond period.

6. The electronic clock tuning system of claim 1 wherein:
    the fine delay means include:
        input means operatively connected to the coarse delay means to receive the clock pulse train;
        output means for outputting the delayed clock pulse train from the fine delay means;
        transmission line means for transmitting the delayed clock pulse train between the input means and the output means;
        a plurality of load means for loading the transmission line means and thereby delaying the clock pulse train by the discrete delay periods; and
        a plurality of transmission gate means, each transmission gate means response to the fine delay select means for switchably interconnecting one of the load means to the transmission line means in response to the digital fine delay select signals.

7. The electronic clock tuning system of claim 6 wherein the fine delay select means include shift register means for serially receiving digital fine delay tuning codes and for producing digital fine delay select signals.

8. The electronic clock tuning system of claim 7 wherein the load means of each fine delay means are binary weighted.

9. The electronic clock tuning system of claim 7 wherein:
- each of the fine delay shift register means is a four bit shift register which receives a four bit digital fine delay tuning code and produces a four bit digital fine delay select signal representative of one of sixteen discrete fine delay periods; and
- each of the fine delay means includes four transmission gate means and four load means, each load means switchably interconnected to the transmission line means by a transmission gate means, wherein each fine delay means delays the clock pulse train by one of sixteen different fine delay periods.

10. The electronic clock tuning system of claim 9 wherein each of the sixteen fine delay periods is a multiple of a one hundred picosecond period.

11. The electronic clock tuning system of claim 1 wherein:
- the tuning code generator means includes means for generating coarse and fine digital delay tuning codes for each gate array in a serial format; and
- the coarse delay select means and the fine delay select means of each gate array are connected in series with one another, and in series with the coarse delay select means and the fine delay select means of all other gate arrays of a region, to receive the digital delay tuning codes in a serial format.

12. An electronic clock tuning system for distributing tuned clock pulse trains to integrated circuit gate arrays of a digital computer in which the gate arrays are organized into a plurality of regions on a circuit board, including:
- master oscillator means for producing a clock pulse train;
- local fanout means mounted with respect to the circuit board and operatively connected to the master oscillator means for distributing the clock pulse train to each region of the circuit board;
- tuning code generator means for generating digital delay tuning codes, for each gate array of a region in a serial format, the tuning codes representative of desired discrete delay periods of the clock pulse trains distributed to the gate arrays of the region; and
- a plurality of electronic delay means, each associated with and mounted with respect to a region of the circuit board and operatively connected to the local fanout means for distributing the clock pulse train to each gate array of the region with which it is associated, and for delaying the distributed clock pulse trains by one of a plurality of discrete delay periods, each electronic delay means comprising:
  - a plurality of delay shift register means, each associated with a gate array of the region, for receiving the digital delay tuning codes and for producing digital delay select signals representative of discrete delay periods in a parallel format, the delay shift register means for each region all being connected in series with one another and in series with the tuning code generator means; and
  - a plurality of delay means each associated with and coupled to receive the delay select signals from one of the delay shift register means, for delaying the clock pulse trains supplied to the gate array with which it is associated by discrete delay periods represented by the digital delay select signals.

13. The electronic clock tuning system of claim 12 wherein:
- the tuning code generator means includes means for generating coarse and fine digital delay tuning codes, for each gate array, representative of desired discrete delay periods of the clock pulse trains distributed to the gate arrays;
- the delay shift register means associated with each gate array includes:
  - coarse delay shift register means for producing digital coarse delay select signals as a function of the coarse delay tuning codes; and
  - fine delay shift register means for producing digital fine delay select signals as a function of the fine delay tuning codes, wherein the coarse delay shift register means and fine delay shift register means for each gate array are coupled in series with one another, and in series with all other coarse delay shift register means and fine delay shift register means; and
- the delay means associated with each gate array include:
  - coarse delay means coupled to the coarse delay shift register means for delaying the clock pulse trains supplied to the gate array by discrete coarse delay periods represented by the coarse delay select signals; and
  - fine delay means coupled to the coarse delay means and to the fine delay shift register means for delaying the clock pulse train supplied to the gate array by discrete fine delay periods represented by the fine delay select signals.

14. The electronic clock tuning system of claim 13 wherein:
- the electronic delay means further includes:
  - electronic delay fanout means coupled to the local fanout means for distributing the clock pulse train; and
  - a plurality of coarse delay elements having an input connected to receive a clock pulse train from the electronic delay array fanout means, and an output, each coarse delay element adapted to delay the received clock pulse train by one of the discrete coarse delay periods; and
- the coarse delay means includes a multiplexer having signal inputs connected to the output of one of the delay elements, a signal output, and control inputs responsive to the coarse delay select means, for supplying at its signal output coarse delayed clock pulse trains represented by the coarse delay select signals.

15. The electronic clock tuning system of claim 13 wherein the fine delay means include:
- input means operatively connected to the coarse delay means to receive the clock pulse train;
- output means for outputting the delayed clock pulse train from the fine delay means;
- transmission line means for transmitting the delayed clock pulse train between the input means and the output means;
- a plurality of load means for loading the transmission line means and thereby delaying the clock pulse train by the discrete delay periods; and
- a plurality of transmission gate means, each transmission gate means response to the fine delay select means for switchably interconnecting one of the load means to the transmission line means in response to the digital fine delay select signals.

* * * * *

UNITED STATES PATENT AND TRADEMARK OFFICE
CERTIFICATE OF CORRECTION

PATENT NO. : 4,714,924

DATED : December 22, 1987

INVENTOR(S) : John H. A. Ketzler

It is certified that error appears in the above-identified patent and that said Letters Patent is hereby corrected as shown below:

Column 7, line 49, after "discrete", add --delay periods of the clock pulse trains distributed to the gate arrays; and--.

Signed and Sealed this

Tenth Day of May, 1988

Attest:

DONALD J. QUIGG

*Attesting Officer*

*Commissioner of Patents and Trademarks*